(12) United States Patent
Samejima et al.

(10) Patent No.: US 8,935,851 B2
(45) Date of Patent: Jan. 20, 2015

(54) METHOD FOR MANUFACTURING A CIRCUIT BOARD

(75) Inventors: Sohei Samejima, Tokyo (JP); Hajime Takeya, Tokyo (JP); Hiroyuki Osuga, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 43 days.

(21) Appl. No.: 13/519,144

(22) PCT Filed: Jan. 12, 2011

(86) PCT No.: PCT/JP2011/000087
§ 371 (c)(1),
(2), (4) Date: Jun. 26, 2012

(87) PCT Pub. No.: WO2011/086895
PCT Pub. Date: Jul. 21, 2011

(65) Prior Publication Data
US 2012/0279765 A1  Nov. 8, 2012

(30) Foreign Application Priority Data
Jan. 13, 2010  (JP) ................................ 2010-004831

(51) Int. Cl.
*H01K 3/10* (2006.01)
*B32B 15/08* (2006.01)
(Continued)

(52) U.S. Cl.
CPC ................. *B32B 15/08* (2013.01); *B32B 15/20* (2013.01); *B32B 25/14* (2013.01); *B32B 27/04* (2013.01);
(Continued)

(58) Field of Classification Search
USPC .............. 29/852, 25, 829, 846; 174/255, 262, 174/266; 428/209, 332, 457, 458, 473.5, 428/901
See application file for complete search history.

(56) References Cited

U.S. PATENT DOCUMENTS 5,670,262 A * 9/1997 Dalman ........................ 428/458
6,869,664 B2 * 3/2005 Vasoya et al. ................ 428/209
(Continued)

FOREIGN PATENT DOCUMENTS

| CN | 101166778 A | 4/2008 |
|----|---|---|
| JP | 63 60557 | 11/1988 |

(Continued)

OTHER PUBLICATIONS

Office Action issued Jun. 25, 2013 in Japanese Patent Application No. 2011-549926 (with English language translation).

(Continued)

*Primary Examiner* — Thiem Phan
(74) *Attorney, Agent, or Firm* — Oblon, Spivak, McClelland, Maier & Neustadt, L.L.P.

(57) ABSTRACT

A method of manufacturing a circuit board includes: forming a first through hole in a core material; forming a first conductive film on an inner wall of the first through hole; forming an insulating layer on both surfaces of the core material and in the first through hole; forming a second through hole in the insulating layer in the first through hole; forming a second conductive film on an inner wall of the second through hole; and forming, on surfaces of the insulating layers formed on the both surfaces of the core material, a signal circuit layer electrically connected to the second conductive film.

5 Claims, 9 Drawing Sheets

(51) Int. Cl.
*B32B 15/20* (2006.01)
*B32B 25/14* (2006.01)
*B32B 27/04* (2006.01)
*H05K 3/02* (2006.01)
*H05K 3/46* (2006.01)
*H05K 1/02* (2006.01)
*H05K 1/03* (2006.01)
*H05K 3/42* (2006.01)

(52) U.S. Cl.
CPC .............. *H05K 3/022* (2013.01); *H05K 3/4608* (2013.01); *H05K 1/0271* (2013.01); *B32B 2305/076* (2013.01); *B32B 2311/12* (2013.01); *B32B 2457/08* (2013.01); *H05K 1/0366* (2013.01); *H05K 3/429* (2013.01); *H05K 2201/0323* (2013.01); *H05K 2201/0358* (2013.01); *H05K 3/4632* (2013.01); *H05K 2201/0187* (2013.01); *H05K 2201/0281* (2013.01)
USPC .................... 29/852; 29/825; 29/829; 29/846

(56) References Cited

U.S. PATENT DOCUMENTS 8,134,085 B2* 3/2012 Samejima et al. ............ 174/262
8,161,636 B2* 4/2012 Yokouchi et al. ............... 29/852
2008/0047742 A1 2/2008 Samejima et al.
2009/0107702 A1 4/2009 Samejima et al.

FOREIGN PATENT DOCUMENTS

| JP | 11 040902 | 2/1999 |
| JP | 2001 332828 | 11/2001 |
| JP | 2006 273954 | 10/2006 |
| JP | WO2006/118059 A1 | 11/2006 |
| JP | 2008 007756 | 1/2008 |
| JP | 2008 066375 | 3/2008 |
| JP | 2008-536298 A | 9/2008 |
| JP | 2009-135415 A | 6/2009 |
| WO | WO 2006/099554 A2 | 9/2006 |

OTHER PUBLICATIONS

International Search Report issued on Mar. 15, 2011 in PCT/JP11/000087 filed on Jan. 12, 2011.
Japanese Office Action issued Feb. 5, 2013 in Patent Application No. 2011-549926 with English Translation.
Combined Chinese Office Action and Search Report issued Jan. 2, 2014 in Patent Application No. 201180005966.9 (with English translation of categories).

* cited by examiner

METHOD FOR MANUFACTURING A
CIRCUIT BOARD

TECHNICAL FIELD

The present invention relates to a method of manufacturing a core material used for a circuit board such as a printed wiring board and a method of manufacturing a circuit board using the core material.

BACKGROUND ART

In recent years, as electronic components become denser, a circuit board such as a printed wiring board is required to have higher heat dissipativity. As a printed wiring board which is excellent in heat dissipativity, a metal core substrate is known and has already been practically used. A metal core substrate uses a metal having a high thermal conductivity such as aluminum or copper as a core material. In the metal core substrate, an insulating layer such as a resin or the like is formed on both surfaces of the core material, wiring is formed on the surface of the insulating layers, and a semiconductor component, a ceramic component, or the like is mounted thereon. The core material may diffuse over the entire substrate heat from such a heat generating component mounted on the surface of the metal core substrate, thereby suppressing temperature rise of the heat generating component. In such a metal core substrate, aluminum having a low specific gravity is usually used as the core material.

However, while the thermal expansion coefficient of aluminum is about 24 ppm/° C., the thermal expansion coefficient of a ceramic component mounted via a solder joint is about 7 ppm/° C., and thus, a heat cycle test conducted on a circuit board having a ceramic component mounted thereon shows a problem that, due to the thermal expansion coefficient difference between aluminum as the core material and the ceramic component, stress is applied between the circuit board and the ceramic component and a crack develops in the solder joint, with the result that reliability in mounting is not obtained.

As a circuit board which may solve such a problem, a circuit board using carbon fiber reinforced plastics (CFRP) as the core material is disclosed (see, for example, Patent Literature 1).

CFRP is a composite material formed of carbon fiber and a resin. A circuit board using CFRP as the core material has a thermal conductivity which is higher than that of aluminum and has a thermal expansion coefficient which is close to that of the ceramic component, and thus, the circuit board is more excellent in thermal conductivity than an aluminum core substrate and is excellent in reliability in mounting.

When a circuit board is manufactured with the use of CFRP as the core material, CFRP having a copper foil attached to both surfaces thereof is used as the core material to be prepared first (see, for example, Patent Literature 2). As such a double-sided copper-clad substrate, a double-sided copper-clad board is disclosed which is manufactured by sandwiching by copper foils the upper and lower surfaces of a prepreg that is a glass fiber sheet impregnated with an epoxy resin and then carrying out pressure forming (see, for example, Patent Literature 3).

CITATION LIST

Patent Literature

[PTL 1] JP 11-40902 A
[PTL 2] JP 2008-66375 A
[PTL 3] JP 63-60557 B

SUMMARY OF INVENTION

Technical Problem

However, in a conventional method of manufacturing a double-sided copper-clad board, it has been found that, when CFRP having a thickness of about 1.5 mm is used and a copper foil having a thickness of about 35 μm is used, a crack develops in the prepreg or the copper foil is separated in the manufactured double-sided copper-clad board.

The present invention has been made to solve the above-mentioned problems, and obtains a method of manufacturing a core material of a double-sided copper-clad board, the double-sided copper-clad board being obtained by attaching a copper foil to both surfaces of a prepreg using CFRP, the method being capable of preventing development of a crack and separation of the copper foil in the prepreg.

Solution to Problem

A method of manufacturing a core material according to the present invention includes: placing a copper foil having a thickness of 9 μm or more and 18 μm or less on both surfaces of a prepreg, the prepreg being formed by impregnating a carbon fiber sheet with a resin containing an elastomer component; and carrying out pressure forming from surfaces of the copper foils.

Further, another method of manufacturing a core material according to the present invention includes: placing a copper foil having a thickness of 9 μm or more and 18 μm or less on both surfaces of a carbon fiber sheet via a resin layer containing an elastomer component, the resin layer being formed on one surface of each of the copper foils; and carrying out pressure forming from another surface of the each of the copper foils.

Advantageous Effects of Invention

According to the present invention, development of a crack and separation of a copper foil in a prepreg in a double-sided copper-clad board can be prevented.

DESCRIPTION OF EMBODIMENTS

Embodiment 1

FIG. 1 are schematic views of a method of manufacturing a core material according to Embodiment 1 for carrying out the present invention.

100 parts by weight of a bisphenol A type epoxy resin, 2 parts by weight of dicyandiamide as a curing agent, 0.5 parts by weight of 2-ethyl-4-methylimidazole as an accelerator, and 20 parts by weight of carboxyl-terminated butadiene-acrylonitrile (CTBN) were mixed. Mixing through agitation was carried out with methyl ethyl ketone being used as a solvent so that the mixture occupied 65 wt % to obtain resin varnish. Pitch-based carbon fiber cloth YS-90A manufactured by NIPPON GRAPHITE FIBER CORPORATION was impregnated with the resin varnish. By carrying out drying at 150° C. for 10 minutes, a prepreg 1 having a thickness of 0.2 mm and having a low elasticity (the elastic modulus of the resin alone when the resin was cured was about 2.5 Gpa) was obtained.

Figure 1A:
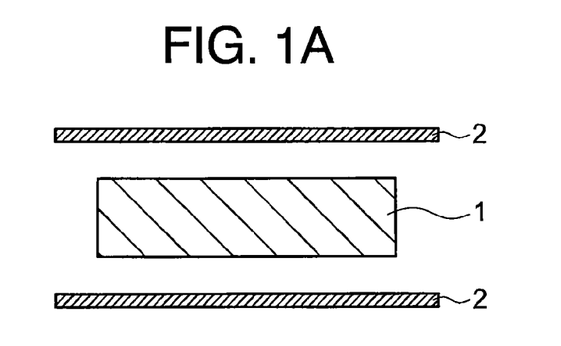
FIG. 1 Schematic views of a method of manufacturing a core material according to Embodiment 1 of the present invention.
Figure 1B:
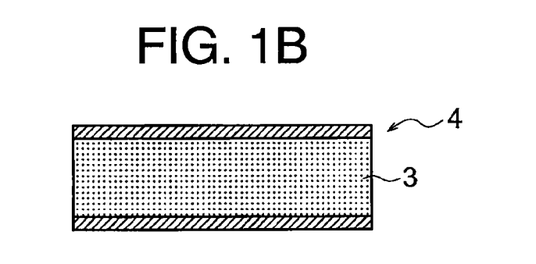

Then, as illustrated in FIG. 1A, a copper foil 2 of 500 mm×500 mm having a thickness of 9 μm was placed on both surfaces of the prepreg 1 of 340 mm×405 mm having a thickness of 0.2 mm. After that, while vacuum pressing with a pressure of 20 kg/cm² was carried out, the temperature was raised at a rate of 3° C./min to 180° C. and then the temperature of 180° C. was maintained for 2 hours to attach the copper foil to both surfaces of the prepreg. Here, in the prepreg, the semi-cured resin with which fibers of the carbon fiber cloth were impregnated was cured to produce a CFRP board 3. Portions of the copper foils which protruded from the prepreg were cut off to manufacture a double-sided copper-clad board 4 as illustrated in FIG. 1B. The double-sided copper-clad board obtained in this way is Example 1.

Samples with the thickness of the copper foil being changed were manufactured through steps similar to those of Example 1 described above. The thicknesses of the copper foils were 6 μm (Comparative Example 1), 12 μm (Example 2), 15 μm (Example 3), 18 μm (Example 4), and 21 μm (Comparative Example 2). In the double-sided copper-clad boards of Examples 1 to 4 and Comparative Examples 1 and 2, a wrinkle at a corner portion was visually observed, and in addition, the double-sided copper-clad boards were cut substantially at the center and the cross sections were observed under an optical microscope to check whether there was a microcrack or not in the CFRP board.

Table 1 shows comparisons on development of a wrinkle at a corner portion and a microcrack in the double-sided copper-clad boards of Examples 1 to 4 and Comparative Examples 1 and 2.

TABLE 1

|  | Comparative Example 1 | Example 1 | Example 2 | Example 3 | Example 4 | Comparative Example 2 |
| --- | --- | --- | --- | --- | --- | --- |
| Thickness of copper foil (μm) | 6 | 9 | 12 | 15 | 18 | 21 |
| Presence or Absence of wrinkle in copper foil | Present | Absent | Absent | Absent | Absent | Absent |
| Presence or Absence of Microcrack | Absent | Absent | Absent | Absent | Absent | Present |

From the results shown in Table 1, it is found that, when the thickness of the copper foils is 9 μm or more and 18 μm or less, a double-sided copper-clad board without a wrinkle at a corner portion, without peeling of the copper foils, and without a microcrack in the CFRP board may be obtained.

A microcrack in the CFRP board is a phenomenon which occurs when the temperature falls from a temperature during vacuum pressing because, while the thermal expansion coefficient of CFRP is ±2 ppm/° C. and thus the CFRP board almost does not thermally contract, the thermal expansion coefficient of the copper foil is as high as 16 ppm/° C. and thus the copper foil contracts more.

More specifically, when the thickness of the copper foil is 18 μm or more, the strength of the copper foil is high, and thus, the CFRP board is compressed, which results in a crack. On the other hand, when the thickness of the copper foil is 9 μm or less, the strength of the CFRP board is high, and thus, reversely, the copper foils are cut.

According to the present invention, a copper foil having a thickness of 9 μm or more and 18 μm or less is attached to both surfaces of the prepreg which is formed of a carbon fiber sheet and a resin, and thus, development of a microcrack and separation of the copper foil may be prevented.

Note that, with regard to conditions for impregnating the carbon fiber cloth with the resin varnish and drying, conditions under which the prepreg does not have tack (adhesion) at room temperature and the complex viscosity of the prepreg is in a range of 500 Pa·s to 10,000 Pa·s when the temperature is in a range of 120° C. to 150° C. are preferred. If the prepreg does not have tack at room temperature, when a copper foil is placed on both surfaces of the prepreg, the copper foil does not adhere to the prepreg, which facilitates alignment and the like. Further, if the complex viscosity of the prepreg is in the range of 500 Pa·s to 10,000 Pa·s when the temperature is in the range of 120° C. to 150° C., the resin does not flow too smoothly, and a CFRP board having a fiber content of 45 to 60% with which the strength becomes the highest may be obtained.

Further, in this embodiment, the resin varnish contains carboxyl-terminated butadiene-acrylonitrile (CTBN) as an elastomer component, but, when the melting temperature falls by adding an elastomer, the conditions may be set so as to satisfy that the complex viscosity of the prepreg is in the range of 500 Pa·s to 10,000 Pa·s when the temperature is in a range of 100° C. to 150° C. The resin varnish is not necessarily required to contain an elastomer component. However, when the resin varnish contains an elastomer component, the elastic modulus of the resin may be reduced to be 3 GPa or less, and, when the resin is used to form the double-sided copper-clad board, the ductility of the CFRP board is improved to improve the heat cycle characteristics (−65° C. to 125° C.).

Note that, in this embodiment, the prepreg having a thickness of 0.2 mm was used, but, with regard to a case where a prepreg having a thickness of 0.35 mm was used, similar results were obtained. It is preferred that the thickness of the prepreg be 1 mm or less. The reason is that, when a circuit board is manufactured with a double-sided copper-clad board being used as the core material, in order to manufacture a circuit board having a thickness of 3 mm or less using two sheets of the core material, it is preferred that the thickness of the core material be 1 mm or less. Further, with regard to the orientation of the carbon fiber, plain woven cloth or triaxial woven cloth is preferred. Through use of carbon fiber having such orientation, there is no peeling at an interface between the carbon fiber and the resin at a heating step or at a cooling step such as a heat cycle.

In a double-sided copper-clad board, due to repeated thermal hysteresis such as a heat cycle, as the sheet is more highly thermally conductive and more highly elastic, a microcrack is more liable to develop. In this embodiment, when the CFRP matrix resin contains an elastomer component, the elastic modulus thereof may be reduced to improve the ductility, and thus, development of a microcrack may be effectively suppressed and the heat cycle characteristics are improved. It is preferred that the elastic modulus of the matrix resin be 3.0 GPa or less.

By the way, carbon fiber is broadly divided into polyacrylonitrile (PAN)-based fiber and pitch-based fiber, and each has a low thermal expansion coefficient of ±2 ppm/K. The elastic modulus of a PAN-based fiber is lower than that of a pitch-based fiber (a general-purpose PAN-based fiber (for example, T300 manufactured by Toray Industries, Inc.) has a tensile elastic modulus of 230 GPa, while a pitch-based fiber (for example, YS-90A manufactured by NIPPON GRAPHITE FIBER CORPORATION) has a tensile elastic modulus of 890 GPa), and thus, it follows that, when a PAN-based fiber is used, a microcrack and wrinkle are less liable to develop. However, with regard to the thermal conductivity, while a PAN-based fiber (for example, T300 manufactured by Toray Industries, Inc.) has a thermal conductivity of 11 W/(m·K), a pitch-based fiber (for example, YS-90A manufactured by NIPPON GRAPHITE FIBER CORPORATION) has a remarkably high thermal conductivity of 500 W/(m·K), and thus, a high degree of heat dissipation is possible.

According to the present invention, even if a pitch-based fiber having a high tensile elastic modulus is used, a microcrack and wrinkle may be suppressed, and thus, a circuit board which has a high thermal conductivity and which is reliable may be obtained.

Further, in this embodiment, a case of a core material of a double-sided copper-clad board is described, but it is not necessarily required to use copper foils, and metal thin films of aluminum, an iron alloy, or the like may also be used. However, in that case, an optimum film thickness for the thermal conductivity of the metal thin films used is set.

Embodiment 2

In Embodiment 2, the resin varnish with which the carbon fiber was impregnated was in advance applied to one surfaces of the copper foils, and the copper foils to which the resin varnish was applied and the carbon fiber were stacked to manufacture a double-sided copper-clad board.

Figure 2A:
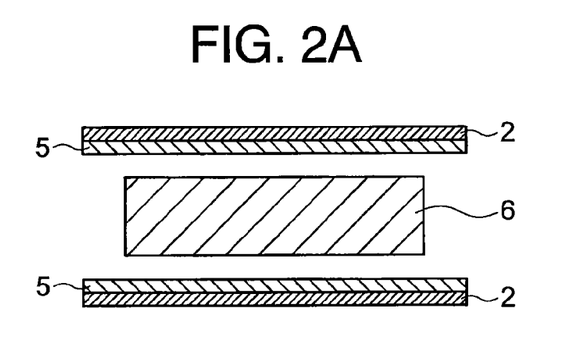
FIG. 2 Schematic views of a method of manufacturing a core material according to Embodiment 2 of the present invention.
Figure 2B:
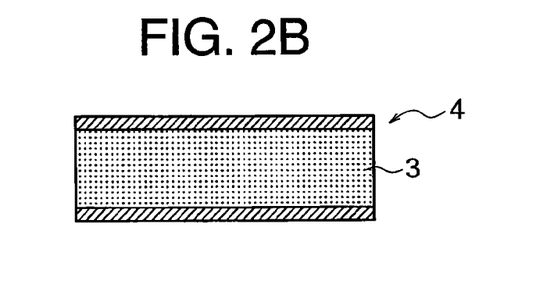

FIG. 2 are schematic views illustrating a method of manufacturing a core material according to this embodiment. The resin varnish similar to the resin varnish of Embodiment 1 was applied to one surfaces of the copper foils 2 having a thickness of 12 μm and was further dried to be in a semi-cured state. With regard to the method of application, screen printing or a coater may be used. The thickness of the semi-cured resin was about 100 μm. As illustrated in FIG. 2A, the two copper foils 2 were placed via semi-cured resin 5 sides on both surfaces, respectively, of carbon fiber cloth 6 which was the same as that of Embodiment 1. After that, while vacuum pressing with a pressure of 20 kg/cm$^2$ was carried out, the temperature was raised at a rate of 3° C./min to 180° C. and then the temperature of 180° C. was maintained for 2 hours to attach the copper foils to both surfaces, respectively, of the prepreg. Here, the semi-cured resin 5 with which fibers of the carbon fiber cloth 6 were impregnated was cured to produce the CFRP board 3. Portions of the copper foils which protruded from the carbon fiber cloth 6 were cut off to manufacture the double-sided copper-clad board 4 as illustrated in FIG. 2B.

In such a method of manufacturing a double-sided copper-clad board, similarly to the case of Example 2 of Embodiment 1, a double-sided copper-clad board without a wrinkle at a corner portion and without a crack in the CFRP board could be obtained.

Embodiment 3

In Embodiment 3, the resin varnish with which the carbon fiber was impregnated was in advance applied to one surfaces of release films, and the release films to which the resin varnish was applied were stacked onto the carbon fiber to attach the resin to the carbon fiber, and then a copper foil was placed thereon, to thereby manufacture a double-sided copper-clad board.

FIG. 3 are schematic views illustrating a method of manufacturing a core material according to this embodiment. The resin varnish similar to the resin varnish of Embodiment 1 was applied to one surfaces of release films 7 having a thickness of 20 μm and was further dried to be in a semi-cured state. With regard to the method of application, screen printing or a coater may be used. The thickness of the semi-cured resin was about 100 μm. As illustrated in FIG. 3A, the two release films 7 were placed via semi-cured resin 5 sides on both surfaces, respectively, of carbon fiber cloth 6 which was the same as that of Embodiment 1. Then, as illustrated in FIG. 3B, the release films 7 were pressed from above and from below to attach the semi-cured resin 5 to both surfaces of the carbon fiber cloth 6, and then, the release films 7 were peeled off.

Figure 3A:
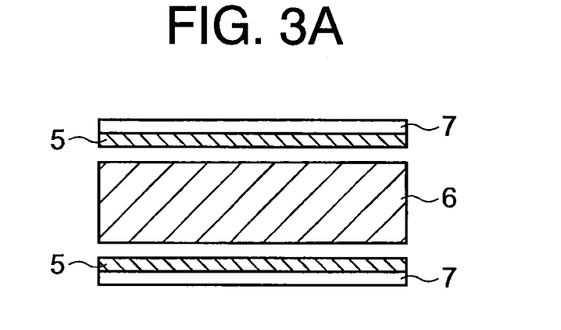
FIG. 3 Schematic views of a method of manufacturing a core material according to Embodiment 3 of the present invention.
Figure 3B:
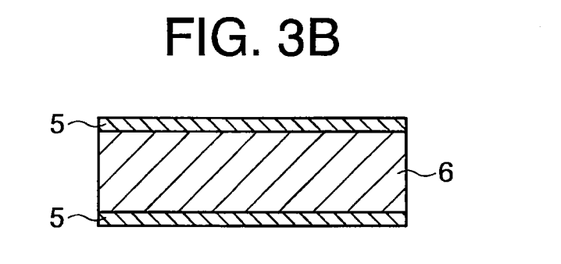
Figure 3C:
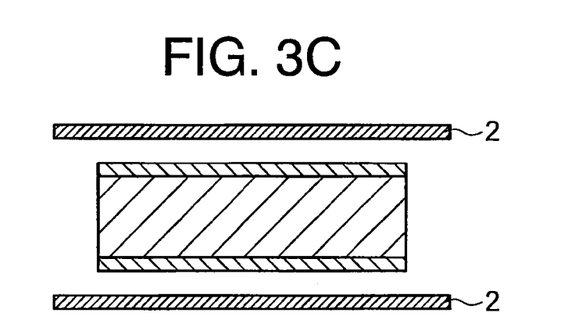
Figure 3D:
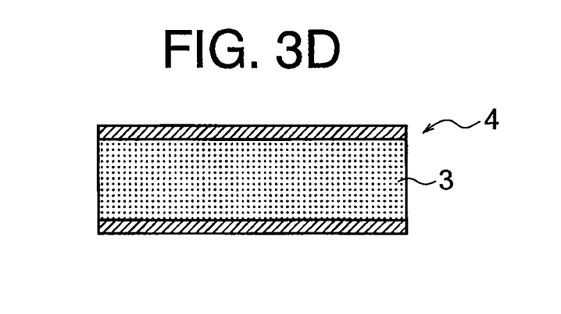

Then, as illustrated in FIG. 3C, the copper foil 2 was placed on both surfaces. After that, while vacuum pressing with a pressure of 20 kg/cm² was carried out, the temperature was raised at a rate of 3° C./min to 180° C. and then the temperature of 180° C. was maintained for 2 hours to attach the copper foils having a thickness of 12 μm to both surfaces, respectively, of the carbon fiber cloth. Here, the semi-cured resin on both surfaces with which fibers of the carbon fiber cloth were impregnated was cured to produce the CFRP board 3. Portions of the copper foils which protruded from the prepreg were cut off to manufacture the double-sided copper-clad board 4 as illustrated in FIG. 3D.

In such a method of manufacturing a double-sided copper-clad board, similarly to the case of Example 2 of Embodiment 1, a double-sided copper-clad board without a wrinkle at a corner portion and without a crack in the CFRP board could be obtained.

In this embodiment, the release films 7 having a thickness of 20 μm were used, but, with regard to a case where release films having a thickness of 25 μm were used, similar results were obtained. The semi-cured resin having a thickness of about 100 μm was used, but with regard to a case where a semi-cured resin having a thickness of 200 μm was used, similar results were obtained.

Embodiment 4

In Embodiment 4, the prepreg of Embodiment 1 was divided and copper foils were attached to both surfaces by vacuum pressing. In Embodiment 1, a copper foil of 500 mm×500 mm having a thickness of 9 μm was attached to both surfaces of the prepreg 2 of 340 mm×405 mm having a thickness of 0.2 mm. However, when the size of any one of the prepreg or the copper foil is 500 mm×500 mm or larger, wrinkle may develop at a corner portion of the double-sided copper-clad board after the stacking. This is because the copper foil at a corner portion is more liable to contract than the copper foil at the center, and because, as the size when the stacking is carried out becomes larger, the amount of the contraction becomes larger.

Figure 4:
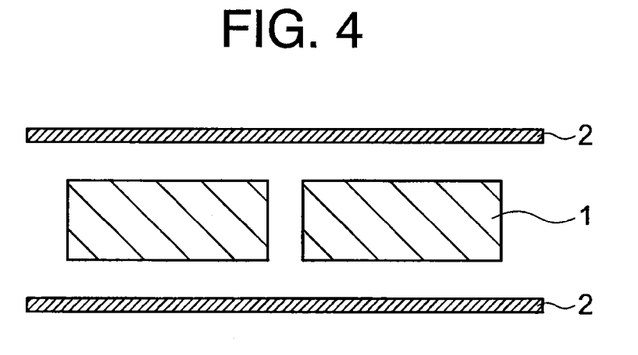
FIG. 4 A schematic view of a method of manufacturing a core material according to Embodiment 4 of the present invention.

FIG. 4 is a schematic view illustrating a method of manufacturing a core material according to this embodiment. The resin varnish similar to that of Embodiment 1 was prepared, and two sheets of carbon fiber cloth YS-90A of 340×405× having a thickness of 200 μm were impregnated with the resin varnish. By carrying out drying at 150° C. for 10 minutes, the resin varnish was semi-cured to obtain two low elasticity prepregs having a thickness of 0.2 mm. The two prepregs 1 were placed side by side with a certain amount of space therebetween as illustrated in FIG. 4, and the copper foil 2 of 800 mm×500 mm having a thickness of 9 μm was placed on both surfaces thereof. After that, while vacuum pressing with a pressure of 20 kg/cm² was carried out, the temperature was raised at a rate of 3° C./min to 180° C. and then the temperature of 180° C. was maintained for 2 hours to attach the copper foil to both surfaces of the prepregs. Here, in the prepregs, the semi-cured resin with which fibers of the carbon fiber cloth were impregnated was cured to produce CFRP boards. Portions of the copper foils which protruded from the prepregs were cut off to manufacture two double-sided copper-clad boards.

In such a method of manufacturing a double-sided copper-clad board, two double-sided copper-clad boards may be manufactured by carrying out vacuum pressing once, and, similarly to the case of Embodiment 1, double-sided copper-clad boards without a wrinkle at a corner portion and without a crack in the CFRP boards could be obtained.

Note that, in this embodiment, prepregs produced by impregnating in advance carbon fiber cloth with resin varnish were used, but, with regard to the methods of manufacturing a double-sided copper-clad board of Embodiment 2 and Embodiment 3, also, two sheets of carbon fiber cloth may be prepared and, by carrying out vacuum pressing once, two double-sided copper-clad boards may be manufactured in a similar way to that of this embodiment.

In this embodiment, the prepreg 2 having a thickness of 0.2 mm was used, but, with regard to a case where a prepreg having a thickness of 0.35 mm was used, similar results were obtained.

Embodiment 5

Figure 5:
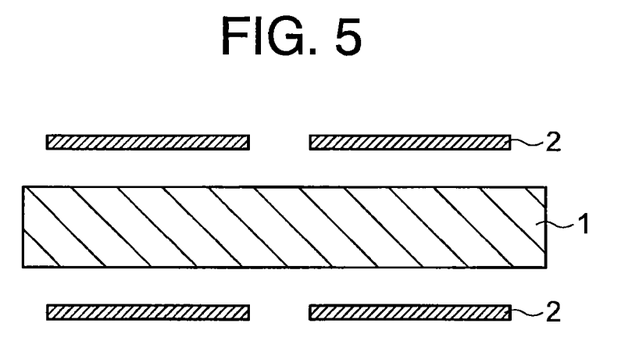
FIG. 5 A schematic view of a method of manufacturing a core material according to Embodiment 5 of the present invention.

In Embodiment 4, the prepreg was divided, but in Embodiment 5, the copper foil was divided and the divided copper foils were produced on both surfaces by vacuum pressing. FIG. 5 is a schematic view illustrating a method of manufacturing a core material according to this embodiment. The resin varnish similar to that of Embodiment 1 was prepared, and the carbon fiber cloth YS-90A was impregnated with the resin varnish. By carrying out drying at 150° C. for 10 minutes, the resin varnish was semi-cured to obtain a low elasticity prepreg of 800 mm×500 mm having a thickness of 0.2 mm. As illustrated in FIG. 5, two copper foils 2 of 360 mm×430 mm having a thickness of 9 μm were placed side by side on both surfaces of the prepreg 1 with a certain amount of space therebetween. After that, while vacuum pressing with a pressure of 20 kg/cm² was carried out, the temperature was raised at a rate of 3° C./min to 180° C. and then the temperature of 180° C. was maintained for 2 hours to attach the copper foils to both surfaces of the prepreg. Here, in the prepreg, the semi-cured resin with which fibers of the carbon fiber cloth were impregnated was cured to produce CFRP boards. The CFRP board was cut along the space between the two copper foils to manufacture two double-sided copper-clad boards.

In such a method of manufacturing a double-sided copper-clad board, two double-sided copper-clad boards may be manufactured by carrying out vacuum pressing once, and, similarly to the case of Embodiment 1, double-sided copper-clad boards without a wrinkle at a corner portion and without a crack in the CFRP boards could be obtained.

Note that, in this embodiment, the prepreg produced by impregnating in advance carbon fiber cloth with resin varnish was used, but, with regard to the methods of manufacturing a double-sided copper-clad board of Embodiment 2 and Embodiment 3, also, two copper foils may be prepared and, by carrying out vacuum pressing once, two double-sided copper-clad boards may be manufactured in a similar way to that of this embodiment.

Further, in this embodiment, the CFRP board was cut along the space between the two copper foils to manufacture two double-sided copper-clad boards, but it is not necessarily required to cut the CFRP board. The copper foils may be in advance cut at a location where the copper foils are unnecessary, if any, when a circuit board is manufactured with the double-sided copper-clad board being used as the core material.

In this embodiment, the prepreg 2 having a thickness of 0.2 mm was used, but, with regard to a case where a prepreg having a thickness of 0.35 mm was used, similar results were obtained.

Embodiment 6

In Embodiment 6, a circuit board was manufactured with the double-sided copper-clad board manufactured by the manufacturing method described in Embodiment 1 being used as the core material.

FIG. 6 are schematic views illustrating a method of manufacturing a circuit board according to this embodiment. First, as illustrated in FIG. 6A, a primary through hole 8 was formed in the double-sided copper-clad board 4. Here, carbon fiber of the CFRP board 3 was exposed, and thus, there was a possibility that carbon powder was formed from the inner wall surface of the primary through hole 8. If carbon powder is formed, when the semi-cured resin is pressed in a subsequent step, the carbon powder may enter the semi-cured resin to lower the dielectric strength voltage. For the purpose of preventing that, as illustrated in FIG. 6B, the inner wall surface of the primary through hole 8 was copper-plated to form a copper coating 9 on the inner wall surface of the primary through hole 8. Then, in order to remove unnecessary portions of the copper foils 2 on the surfaces of the double-sided copper-clad board, patterning was carried out with a resist film, the unnecessary portions of the copper foils were removed by etching, and, as illustrated in FIG. 6C, the copper foils 2 and the copper coating 9 were caused to remain only in the primary through hole 8 and on the periphery thereof.

Figure 6A:
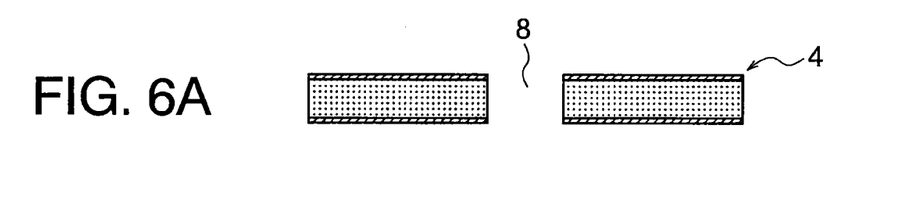
FIG. 6 Schematic views of a method of manufacturing a circuit board according to Embodiment 6 of the present invention.
Figure 6B:
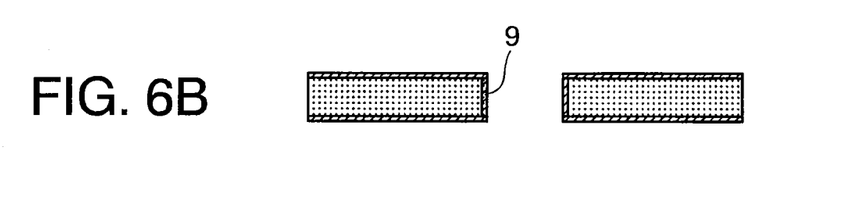
Figure 6C:
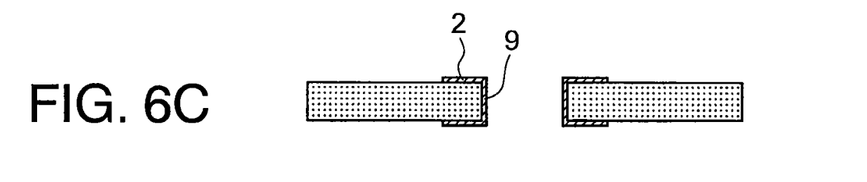
Figure 6D:
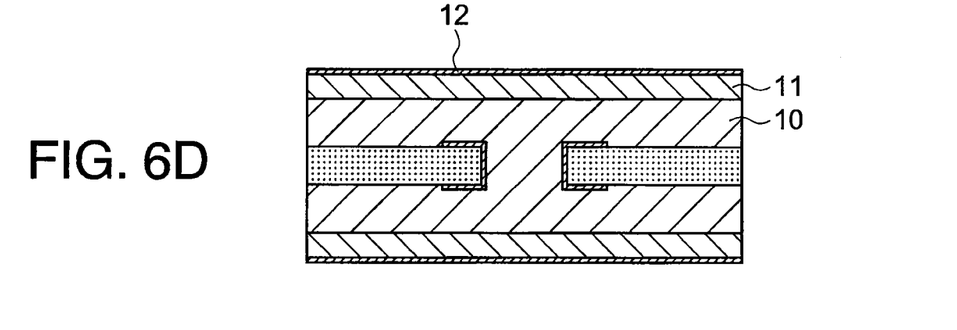

Next, a semi-cured silica-containing epoxy resin sheet 10 to be an electrically insulating layer and a resin prepreg 11 of an epoxy base material were stacked, and, as illustrated in FIG. 6D, heating and curing with vacuum pressing were carried out. Here, the primary through hole 8 was filled with the silica-containing epoxy resin 10 (30 ppm/K and 3.0 W/(m·K)).

Then, a secondary through hole 13 having a smaller diameter was formed so as to be coaxial with the primary through hole.

Finally, the inner wall surface of the secondary through hole 13 was copper-plated to form a copper coating 14 on the inner wall surface of the secondary through hole 13, copper coatings 12 on the surfaces of the epoxy base material 11 were patterned to form a signal circuit layer, and, as illustrated in FIG. 6 E, a circuit board having a through hole formed therein was manufactured.

Figure 6E:
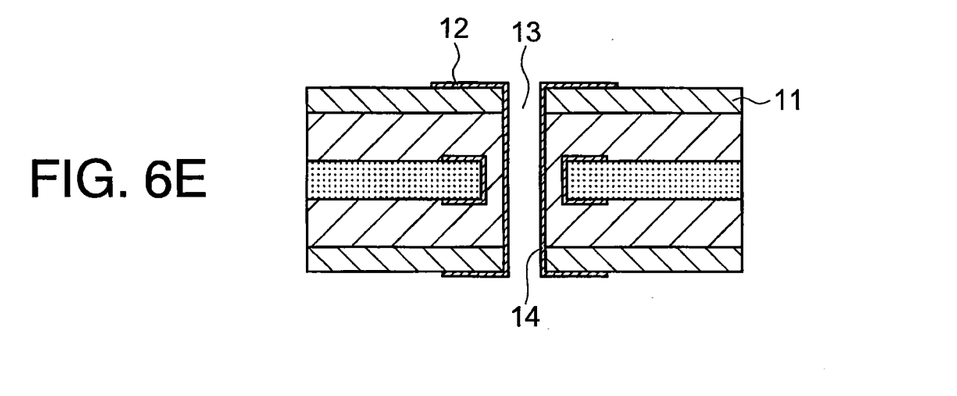

More specifically, the first through hole 8 was formed in the core material 3 which was formed by placing a metal thin film on both surfaces of a carbon fiber sheet that included a resin containing an elastomer component, and the first conductive film 9 was formed on the inner wall of the first through hole 8. The insulating layer was formed with the resin sheet 10 on both surfaces of the core material 3 and in the first through hole 8, and the second through hole 13 was formed on the insulating layer in the first through hole 8. The second conductive film 14 was formed on the inner wall of the second through hole 13, and the signal circuit layer (not shown) which was electrically connected to the second conductive film 12 was formed on the surface of the insulating layer formed on both surfaces of the core material 3. In this way, the circuit board could be manufactured.

In the circuit board manufactured in this way, the signal circuit layers formed on both surfaces, respectively, are electrically connected to each other via the through hole, and, similarly to the case of the double-sided copper-clad board, there is an effect that a crack does not develop in a heat cycle test.

Note that, in this embodiment, the inner wall surface of the primary through hole was covered with the copper coating, but the copper coating is not necessarily required as long as detachment of carbon powder from the inner wall surface of the primary through hole is prevented.

In this embodiment, the silica-containing epoxy resin sheet was used as the semi-cured resin sheet 10, and the resin prepreg 11 of a glass epoxy base material was stacked thereon, followed by carrying out heating and curing with vacuum pressing. However, the semi-cured resin sheet 10 may be temporarily subjected to crimping under predetermined conditions (for example, at 120° C. for 2 min with 10 kg/cm$^2$), may be sandwiched between metal plates (for example, SUS plates) which are treated for easy release with a fluoroplastic or the like, and may be subjected to vacuum lamination to fill the primary through hole 8 with the resin of the resin sheet 10. In this case, it is enough that the resin prepreg 11 and the copper foil 12 are stacked, and, as illustrated in FIG. 6D, heating and curing with vacuum pressing are carried out under predetermined conditions (for example, at 180° C. for 2 min with 20 kg/cm$^2$).

Taking into consideration the thermal expansion coefficient of the carbon fiber (±2 ppm/K), it is preferred that filler be included in the resin sheet 10. In this embodiment, a case where silica was used is exemplified, but alumina (aluminum oxide), aluminum nitride, boron nitride, or the like may also be used. By using an alumina-containing epoxy resin, a resin sheet having a thermal expansion coefficient of about 30 ppm/K and a thermal conductivity of about 3.0 W/(m·K) may be manufactured.

Embodiment 7

FIG. 7 are schematic views of a method of manufacturing a circuit board according to Embodiment 7.

Figure 7A:
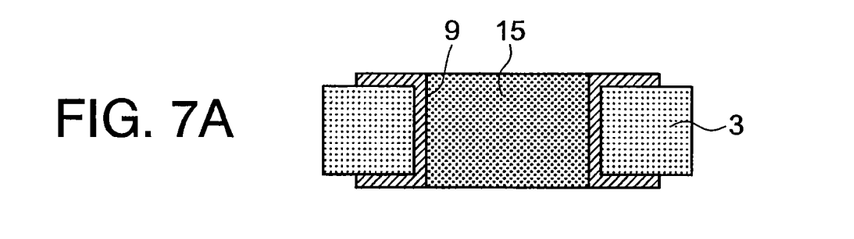
FIG. 7 Schematic views of a method of manufacturing a circuit board according to Embodiment 7 of the present invention.
Figure 7B:
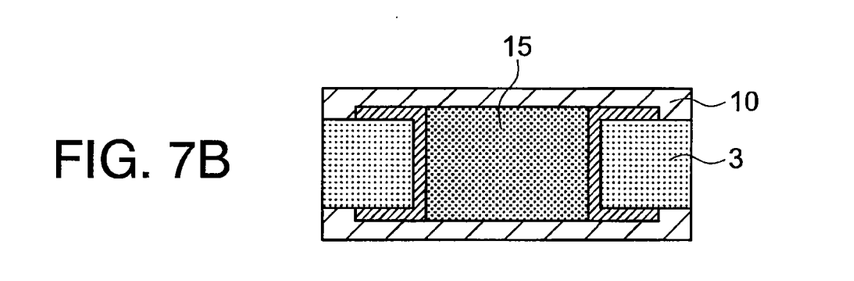
Figure 7C:
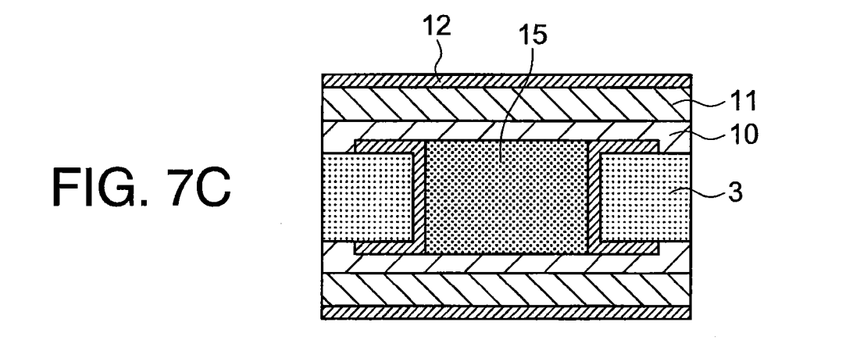
Figure 7D:
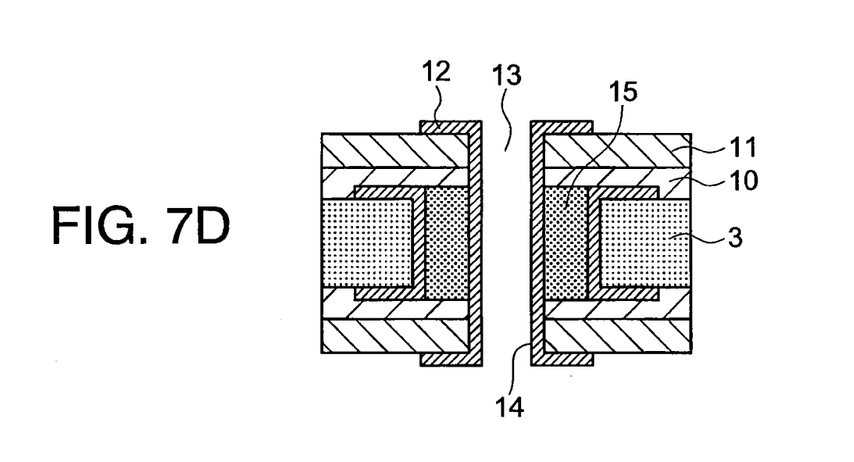

In this embodiment, the steps were similar to those of Embodiment 6 up to the one illustrated in FIG. 6C to form the primary through hole 8. Then, as illustrated in FIG. 7A, resin paste 15 was filled in the primary through hole 8 by printing. Further, as illustrated in FIG. 7B to FIG. 7D, the semi-cured resin sheet 10 was temporarily subjected to crimping, the resin prepreg 11 of a glass epoxy base material and the copper foil 12 were stacked, heating and curing with vacuum pressing were carried out, and the secondary through hole 13 was provided to manufacture the circuit board having the through holes formed therein.

Here, a filler-containing epoxy resin paste was used as the resin paste 15. As the filler, silica, alumina (aluminum oxide), aluminum nitride, boron nitride or the like may be appropriately used.

As in the above-mentioned Embodiment 6, when the resin sheet 10 is thermally molten to fill the primary through hole 8, the resin sheet 10 corresponding to the thickness of the core material is required. However, according to this embodiment, the resin may be filled only in the primary through hole 8, and thus, a thin circuit board may be manufactured.

Embodiment 8

Figure 8A:
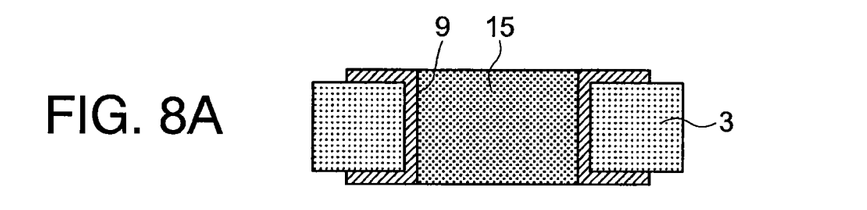
FIG. 8 Schematic views of a method of manufacturing a circuit board according to Embodiment 8 of the present invention.
Figure 8B:
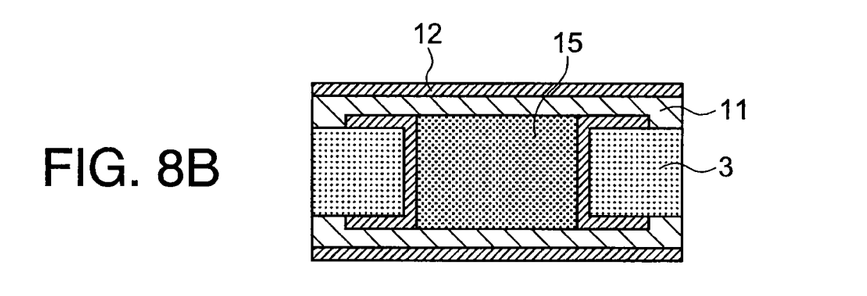
Figure 8C:
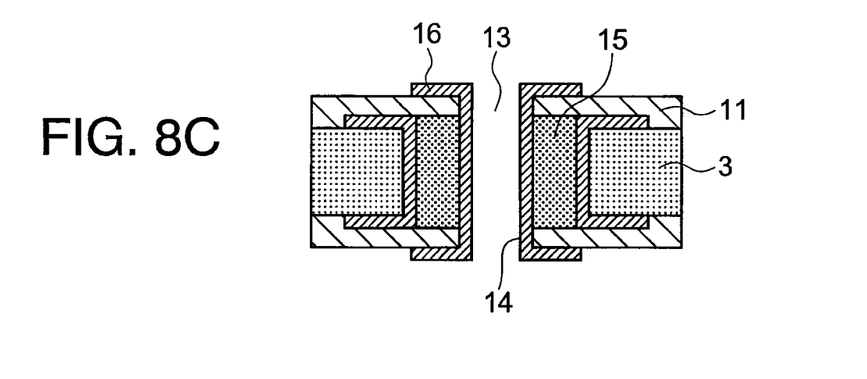

FIG. 8 are schematic views of a method of manufacturing a circuit board according to Embodiment 8. In this embodiment, the steps were similar to those of Embodiment 6 up to the one illustrated in FIG. 6C to form the primary through hole 8. Then, as illustrated in FIG. 8A, resin paste 15 was filled in the primary through hole 8 by printing. Further, as illustrated in FIG. 8B and FIG. 8C, without using the resin sheet 10, the resin prepreg 11 of a glass epoxy base material and the copper foil 12 were stacked, and heating and curing with vacuum pressing were carried out.

More specifically, the first through hole 8 was formed in the core material 3 which was formed by placing a metal thin film on both surfaces of a carbon fiber sheet that included a resin containing an elastomer component, and the first conductive film 9 was formed on the inner wall of the first through hole 8. The insulating layer was formed with the resin paste 15 on both surfaces of the core material 3 and in the first through hole 8, and the second through hole 13 was formed in the insulating layer in the first through hole 8. The second conductive film 14 was formed on the inner wall of the second through hole 13, and the signal circuit layer 16 which was electrically connected to the second conductive film 12 was formed on the surface of the insulating layer formed on both surfaces of the core material 3. In this way, the circuit board could be manufactured.

In this embodiment, the resin sheet 10 is not provided, and thus, a still thinner circuit board may be manufactured.

However, the signal line 16 is close to the CFRP board 3, and thus, in order to improve the resistance to a heat cycle, it is good to use Embodiments 6 and 7.

Figure 9:
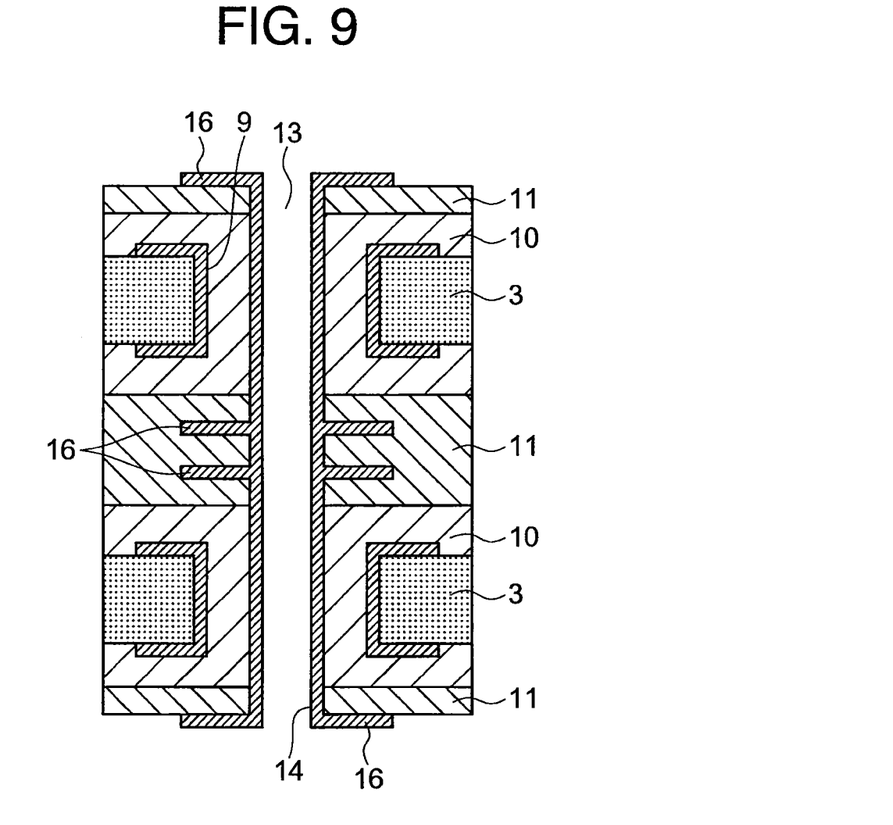
FIG. 9 A schematic view of a method of manufacturing a circuit board according to the present invention.
Figure 10:
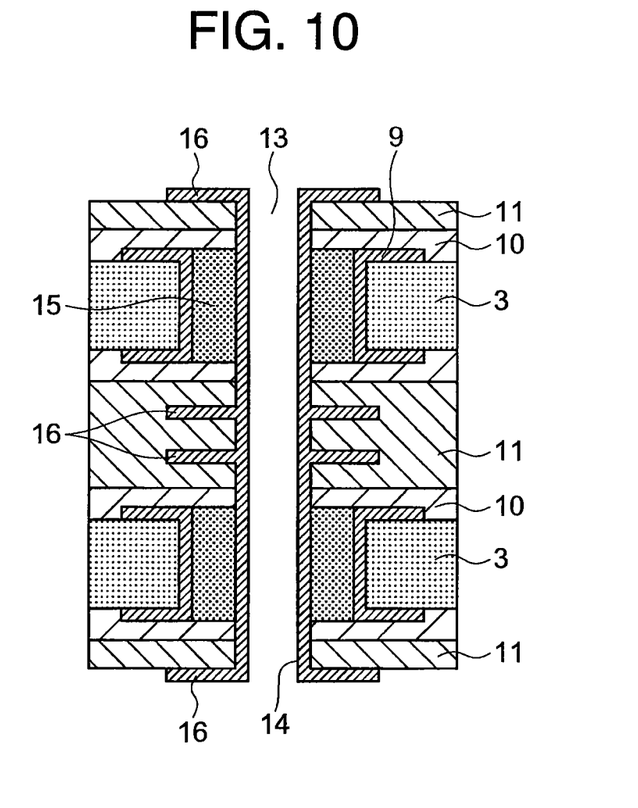
FIG. 10 A schematic view of a method of manufacturing a circuit board according to the present invention.
Figure 11:
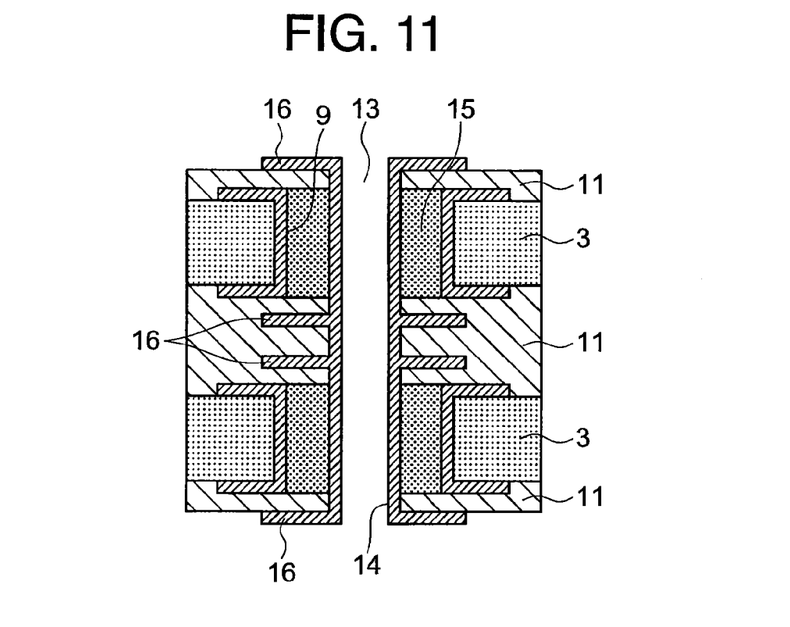
FIG. 11 A schematic view of a method of manufacturing a circuit board according to the present invention.
Figure 12:
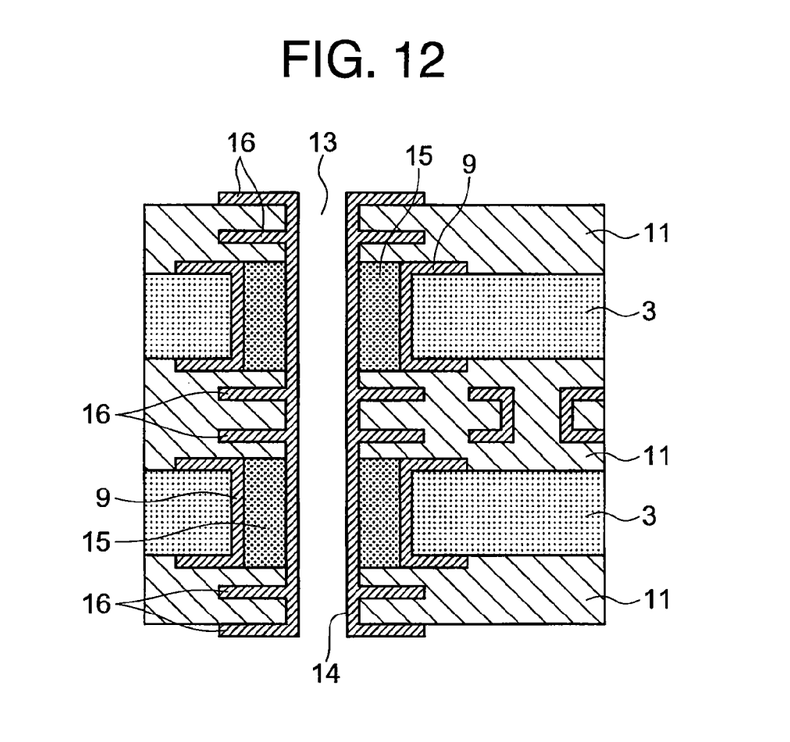
FIG. 12 A schematic view of a method of manufacturing a circuit board according to the present invention.

Note that, Embodiments 6 to 8 exemplify cases in which one CFRP board 3 is included. However, as illustrated in FIG. 9 to FIG. 11, a plurality of CFRP boards 3 may be included and a plurality of layers of the signal lines 16 may be formed. By using Embodiment 8, planarization and multi-layering may be carried out, which is preferred. By placing a plurality of CFRP boards 3, heat generated from components may be more easily diffused. In FIG. 9 to FIG. 11, there is only one layer of the signal line 16 outside the CFRP board 3, but, as illustrated in FIG. 12, there may be a plurality of layers, and those may be connected to an inner layer.

REFERENCE SIGNS LIST 1 prepreg, 2 copper foil, 3 CFRP board, 4 double-sided copper-clad board, 5 semi-cured resin, 6 carbon fiber cloth, 7 release film, 8 primary through hole, 9 copper coating, 10 epoxy resin sheet, 11 resin prepreg, 12 copper coating, copper foil, 13 secondary through hole, 14 copper coating, 15 resin paste, 16 signal line

The invention claimed is:

1. A method of manufacturing a circuit board, comprising the steps of:
    forming a core material by attaching a copper foil having a thickness of 9 μm or more and 18 μm or less on both surfaces of a prepreg while subjecting the prepreg with the attached copper foil to an elevated temperature, the prepreg being formed by impregnating carbon fiber cloth made of a pitch-based fiber with a resin which contains an elastomer component and in which an elastic modulus when cured is 3 GPa or less;
    forming a first through hole in the core material;
    forming a first conductive film on an inner wall of the first through hole;
    forming an insulating layer on both surfaces of the core material and in the first through hole;
    forming a second through hole in the insulating layer in the first through hole;
    forming a second conductive film on an inner wall of the second through hole; and
    forming, on surfaces of the insulating layers formed on the both surfaces of the core material, a circuit layer electrically connected to the second conductive film.

2. The method of manufacturing a circuit board according to claim 1, wherein the step of forming a core material comprises:
    applying varnish containing the resin on one surface of each of the copper foils and carrying out drying to form a semi-cured resin;
    placing the copper foil on both surfaces of the carbon fiber cloth via the semi-cured resin; and
    applying pressure from another surface of the each of the copper foils to cause the cloth to be impregnated with the semi-cured resin.

3. The method of manufacturing a circuit board according to claim 1, wherein the step of forming a core material comprises:
    applying varnish containing the resin on one surface of each of release films and carrying out drying to form a semi-cured resin;
    placing the release film on both surfaces of the carbon fiber cloth via the semi-cured resin, applying pressure from another surface of the each of the release films to attach the semi-cured resin on both surfaces of the carbon fiber cloth, and thereafter peeling the release films;
    placing the copper foil on surfaces of the semi-cured resin which are exposed on the both surfaces of the carbon fiber cloth; and
    applying pressure from the surfaces of the copper foils to cause the carbon fiber cloth to be impregnated with the semi-cured resin.

4. The method of manufacturing a circuit board according to claim 1, wherein the step of forming a core material comprises attaching copper foils with space therebetween on both surfaces of the prepreg, the prepreg being obtained by impregnating the carbon fiber cloth with varnish containing the resin and then carrying out drying.

5. The method of manufacturing a circuit board according to claim 1, wherein the prepreg with the attached copper foil are vacuum pressed and heated to 180° C.

* * * * *